United States Patent [19]

Yun

[11] Patent Number: 5,214,395

[45] Date of Patent: May 25, 1993

[54] PARASITIC SIGNAL SUPPRESSION CIRCUIT FOR AN EXTREMELY HIGH FREQUENCY OSCILLATOR

[75] Inventor: Ki-ho Yun, Suwon, Rep. of Korea

[73] Assignee: Samsung Electronics Co., Ltd., Kyunggi, Rep. of Korea

[21] Appl. No.: 796,443

[22] Filed: Nov. 22, 1991

[30] Foreign Application Priority Data

Jun. 29, 1991 [KR] Rep. of Korea ............... 91-11043

[51] Int. Cl.$^5$ ............... H03B 1/04; H03F 3/60
[52] U.S. Cl. ............... 331/77; 330/53; 330/286; 330/302; 331/99
[58] Field of Search ............... 331/74, 75, 77, 96, 331/99, 107 SL, 117 D, 25; 455/318, 319, 320; 333/175, 176, 204; 328/165, 167; 302/53, 286, 302, 303, 306

[56] References Cited

U.S. PATENT DOCUMENTS 5,051,706 9/1991 Zushi ............... 330/306 X
5,079,524 1/1992 Sugawara ............... 331/107 SL

FOREIGN PATENT DOCUMENTS 56-58305 5/1981 Japan ............... 330/286

Primary Examiner—Siegfried H. Grimm
Attorney, Agent, or Firm—Rothwell, Figg, Ernst & Kurz

[57] ABSTRACT

An extremely high frequency parasitic signal suppression circuit for use in a local oscillator of an extremely high frequency radio or satellite communication system to eliminate parasitic signals included in a local oscillation signal. A first direct current cut-off device consisting of a microstrip line is connected between the output terminal of a phase-locked oscillator and the input of an amplifier, and to a first low pass filter to supply a direct current source for the amplifier. A second direct current cut-off device and second low pass filter are connected to the output terminal of the amplifier in the same manner as the input terminal.

3 Claims, 3 Drawing Sheets

PARASITIC SIGNAL SUPPRESSION CIRCUIT FOR AN EXTREMELY HIGH FREQUENCY OSCILLATOR

BACKGROUND OF INVENTION

The present invention relates to a local oscillator for generating a local oscillation signal for frequency conversion in a radio frequency receiving terminal (RF Front End) of a radio or satellite communication apparatus that transmits information in an extremely high frequency (EHF) band, and more particularly, to a circuit that suppresses parasitic signals accompanying the local oscillation signal.

Ordinarily, a radio or satellite telecommunication device that uses the extremely high frequency band (above 3 GHz), converts the audio and image information of a baseband frequency into an extremely high frequency band for transmission and converts a high frequency signal of the extremely high frequency band that is received into a baseband. To do this, a local oscillator of the device must generate a local oscillation frequency above a certain number of gigahertz (10$^9$/sec.). In addition, a phase-locked oscillator that uses a phase-locked loop is used as a local oscillator device in radio and satellite telecommunication devices that use at an extremely high frequency. However, at the phase-locked oscillator output, a parasitic signal appears which is multiplied along with the output signals of a high stability oscillator (such as a crystal oscillator) used as a reference oscillator of the phase-locked loop. When used as a local oscillator for primary frequency conversion of an oscillator RF front end having such a characteristic, the main signal and parasitic signal which include information in the primary intermediate frequency band (ordinarily the 1 GHz band) become amplified (up to approximately 30 db) together in an intermediate frequency amplifier, deteriorating the receiving characteristics to demodulate information.

FIG. 1 shows a circuit of the conventional local oscillator. FIG. 1 shows a multiplier 11, phase comparator 12, low-pass filter 13, and directional coupler 15 used to construct a phase-locked loop for stabilizing a voltage controlled oscillator 14 of the EHF band by the output of a reference oscillator 20 having a certain hundred Mhz oscillation frequency in order to solve the aforementioned problem. After the output is amplified in an amplifier 40, a band pass filter 50 is positioned at the output terminal of the oscillator to pass only the oscillator signal of the required frequency and suppress the parasitic signals. Circuit parameter design of the bandpass filter is set in accordance with the desired characteristics and frequency band and a microstrip line of approximately 30-80 mm is required in order to attain a cut-off characteristic for a 50 db parasitic signal in a 4 GHz or 12 GHz frequency band generally used in satellite telecommunication and the size of the mechanism should be set according to this.

The oscillator illustrated in FIG. 1 is the 10.75 GHz local oscillator used in a receiver of an outdoor VSAT (Very Small Aperture Terminal) system having a 12 GHz band currently in service in the United States.

Here, the oscillation frequency of the reference oscillator 20 is 50 MHz and a high stability quartz crystal oscillator is ordinarily used. A phase-locked loop is used to phase-lock to the reference oscillator 20 in order to improve the degree of stability of a 10.75 GHz voltage controlled oscillator 14. In this process, among the output signals of phase-locked oscillator 10, multiple frequencies of 50 MHz to 1 GHz along with the main 10.75 GHz signal are weakly spread out ($-60$ dbc, here, dbc is relative signal strength to the main 10.75 GHz signal) to 1 GHz and overlap the 0.95 GHz-1.45 GHz band which is the first intermediate frequency band. As this takes place, the receiving characteristics are deteriorated when restoring information and to solve this, a 10.75 GHz pass band filter 50 is used at the output terminal of an amplifier 40. Composition of the pass band filter 50 is not simple and its size is not a small problem for concern. Therefore, the conventional EHF oscillator parasitic signal suppression circuit is enlarged in size.

SUMMARY OF THE INVENTION

Accordingly, it is an object of the present invention to provide a parasitic signal suppression circuit of an extremely high frequency oscillator in a local oscillation device which can be simplified and reduced in size.

In order to achieve the above stated object, the present invention has a direct current (DC) power source cut-off device formed by a microstrip line that connects to an output terminal of a phase-locked oscillator which is a local oscillation device of an EHF oscillator of the EHF frequency band, and a low pass filter that connects to the input terminal of an amplifier to supply a direct current source to the amplifier. A low pass filter and direct current cut-off device are also connected to the output terminal of the amplifier in the same way as the input terminal to suppress parasitic signals at the same time a direct current source is supplied to the amplifier so that only the main signal is allowed to pass.

DETAILED DESCRIPTION ON THE INVENTION

Now, a description in greater detail follows with reference to the accompanying drawings.

Figure 1:
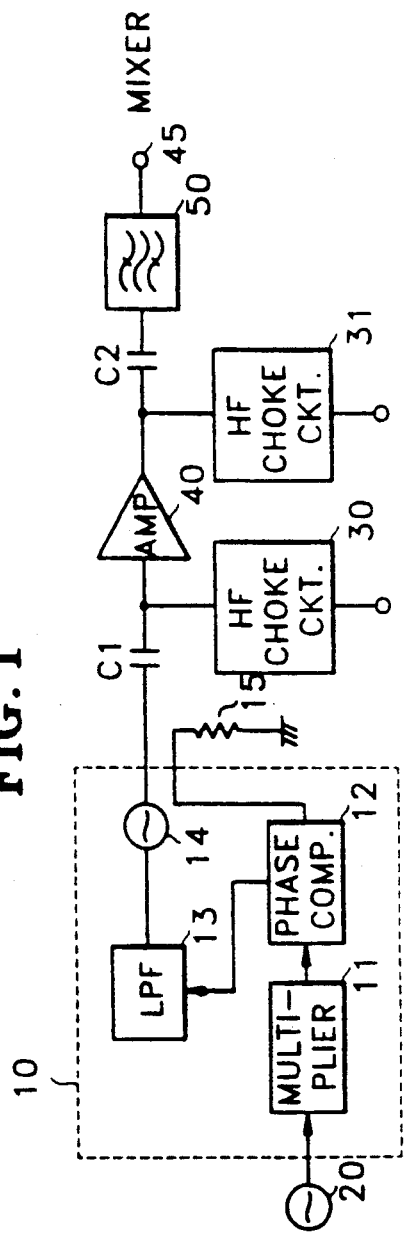
FIG. 1 is a block diagram of the conventional local oscillator device.
Figure 2:
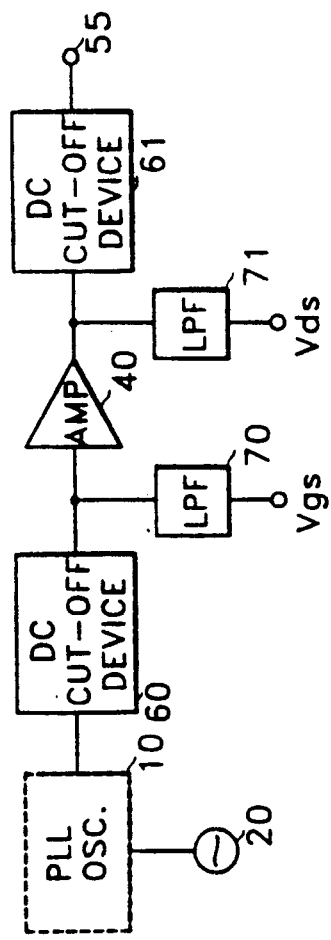
FIG. 2 is a block diagram of a local oscillator according to the present invention.

FIG. 2 is a block diagram of one preferred embodiment of a local oscillation device according to the present invention. The phase-locked oscillator section 10 shown in FIG. 2 is substantively similar to that of FIG. 1 and in order to obtain characteristics equal to the pass band filter 50 of FIG. 1, the local oscillator is constructed by substituting for the high frequency choke circuits 30 and 31 and direct current blocking capacitors C1 and C2 (used as the power supply circuit of buffer amplifier 40 shown in FIG. 1) with low pass filters 70 and 71 and direct current cut-off devices 60 and 61 each utilizing a microstrip line.

Specifically, each of direct current cut-off devices 60 and 61 is a type of filter that uses a microstrip line and has a direct current cut-off role as well as a parasitic signal frequency cut-off role by having a high impedance against a parasitic signal frequency. The low pass filters 70 and 71 are filters that pass the parasitic signal frequency band and have the characteristic of blocking the transmission of the desired oscillation frequency to the first and second power supply sources and are also used as a path to first and second direct current supply sources (Vgs and Vd). Therefore, the local oscillation device comprises a phase-locked oscillator PLO 10, buffer amplifier 40 to buffer the signal from the PLO, low pass filters 70 and 71 and the direct current cut-off devices 60 and 61 that are current power source circuits for buffer amplifier 40 in order to suppress the parasitic component among the signal output from the PLO 10.

Figure 3:
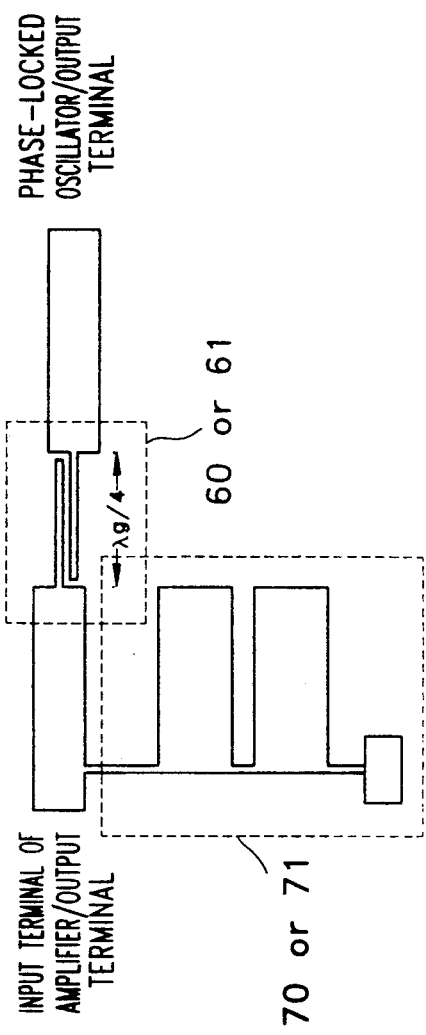
FIG. 3 shows a microstrip line of the direct current cut-off device and low pass filter in FIG. 2.
Figure 4:
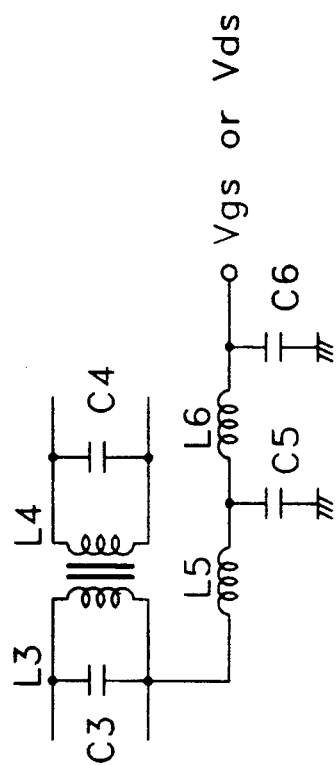
FIG. 4 is an equivalent circuit diagram of FIG. 3.

FIG. 3 shows that the direct current cut-off devices 60 and 61 and low pass filters 70 and 71 which are used as the power source circuit to the input/output terminal of buffer amplifier 40 are designed as microstrip lines, which is an important part of the present invention. FIG. 4 also shows an equivalent circuit to that of FIG. 3 constructed with inductors and capacitors.

As seen in FIG. 4, direct current cut-off devices 60 and 61 are equivalently made up of two parallel LC resonators consisting of inductors L3 and L4 and capacitors C3 and C4. Only a signal corresponding to the resonant frequency of a resonator according to the combined LC properties between them is passed and there is a high impedance with respect to the parasitic signal of the 1 GHz low frequency band accompanying the direct current or phase-locked oscillation signal from PLO 10 to greatly suppress the transmitted signal strength. In the low pass filters 70 and 71 composed of inductors L5 and L6 and capacitors C5 and C6, the parasitic signal that is blocked in the parallel resonator of the direct cut-off device becomes transmitted to first and second direct current voltage sources (Vgs and Vds) when the pass band of the low pass filter is the same as the parasitic signal and the cut-off frequency is the same frequency as the oscillation signal of oscillator 10; whereas, the oscillation signal of phase-locked oscillator 10 is transmitted to the parallel resonator because transmission through the filters 70 and 71 becomes cut-off.

Accordingly, when assessing the circuit operation of FIG. 2, phase-locked oscillator 10 outputs, together with the desired main signal, a multiple frequency parasitic output of reference oscillator 20 which has a very large output during the phase locking process. The phase locking process is used to improve the degree of stability of voltage controlled oscillator 14 of the EHF band containing a desired frequency. Such parasitic signals deteriorate the receiving characteristics when using a phase-locked oscillator 10 as a local oscillator of the receiver. In the present invention, the output signal of the phase-locked oscillator 10 is not attenuated as in the operation described with regard to FIG. 1. Instead, when using a circuit as in FIG. 3, that is used as a power supply circuit of amplifier 40 connected with phase-locked oscillator 10 at the input/output terminal of amplifier 40 it is thus possible to control the parasitic signal only.

Figure 5:
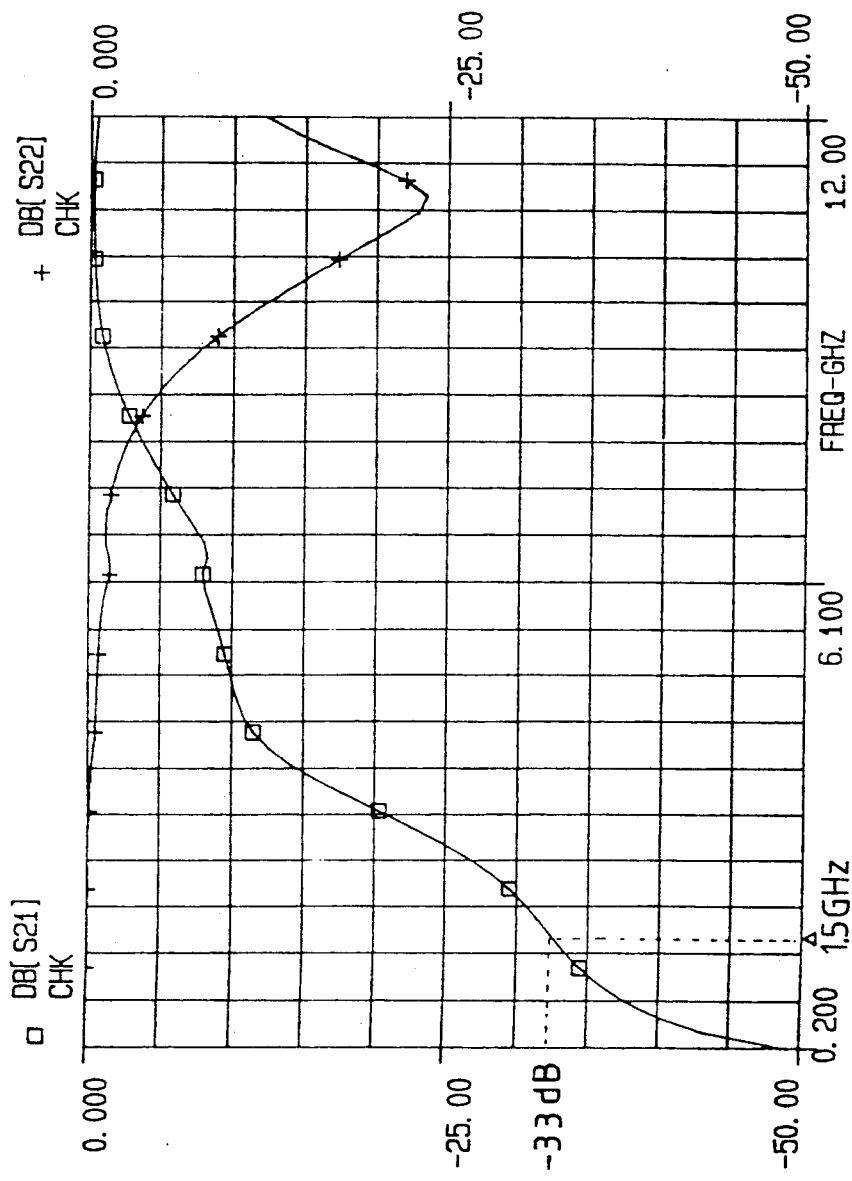
FIG. 5 is a graphic representation of the output characteristics of the local oscillator shown in FIG. 2.

FIG. 5 shows the output characteristics of the device shown in FIG. 2. As seen in FIG. 5, there is an attenuation of a parasitic signal to about 30 db at 1.5 GHz and parasitic signal suppression effect of a minimum of more than 60 db when used simultaneously at the input/output terminal of amplifier 40.

Accordingly, through the application of a circuit used as a power supply source of an amplifier positioned at the output terminal of a phase locked oscillator, the present invention departs from the conventional pass band filter means as a circuit to prevent deterioration of the receiving characteristics due to parasitic signals and enables not only circuit simplification but also reduction in size and improved economy by eliminating the use of the conventional pass band filter in the manufacture of a high stability oscillator of the microwave band.

What is claimed is:

1. A parasitic signal suppression circuit for an extremely high frequency (EHF) local oscillation device having an EHF oscillator, comprising:
   a first direct current cut-off device connected between an output of said EHF oscillator and an input of an amplifier;
   a first low-pass filter coupled at one end thereof between said first direct current cut-off device and said amplifier and coupled to a direct current power source at the other end thereof for supplying said direct current power source to said amplifier;
   a second direct current cut-off device connected between an output of said amplifier and an output of said EHF local oscillation device; and
   a second low-pass filter coupled at one end thereof between said output of said amplifier and said second direct current cut-off device and coupled to a direct current supply source at the other end thereof for supplying said direct current supply source to said amplifier;
   wherein said first and second direct current cut-off devices are composed of parallel resonators having a cut-off frequency matching an intermediate frequency band frequency of a device in which said EHF local oscillation device is provided;
   said parasitic signal suppression circuit suppressing a parasitic signal at the output of said EHF oscillator from being transmitted to said output of the EHF local oscillation device and simultaneously passing a desired main signal to said output of said EHF local oscillation device.

2. A parasitic signal suppression circuit for an extremely high frequency (EHF) local oscillation device having an EHF oscillator, comprising:
   a first direct current cut-off device connected between an output of said EHF oscillator and an input of an amplifier;
   a first low-pass filter coupled at one end thereof between said first direct current cut-off device and said amplifier and coupled to a direct current power source at the other end thereof for supplying said direct current power source to said amplifier;
   a second direct current cut-off device connected between an output of said amplifier and an output of said EHF local oscillation device; and
   a second low-pass filter coupled at one end thereof between said output of said amplifier and said second direct current cut-off device and coupled to a direct current supply source at the other end thereof for supplying said direct current supply source to said amplifier;
   said parasitic signal suppression circuit suppressing a parasitic signal at the output of said EHF oscillator from being transmitted to said output of the EHF local oscillation device and simultaneously passing a desired main signal to said output of said EHF local oscillation device;

wherein a pass band of said first and second low-pass filters matches a frequency band of said parasitic signal.

3. A parasitic signal suppression circuit for an extremely high frequency (EHF) local oscillation device having an EHF oscillator, comprising:
- a first direct current cut-off device connected between an output of said EHF oscillator and an input of an amplifier;
- a first low-pass filter coupled at one end thereof between said first direct current cut-off device and said amplifier and coupled to a direct current power source at the other end thereof for supplying said direct current power source to said amplifier;
- a second direct current cut-off device connected between an output of said amplifier and an output of said EHF local oscillation device; and
- a second low-pass filter coupled at one end thereof between said output of said amplifier and said second direct current cut-off device and coupled to a direct current supply source at the other end thereof for supplying said direct current supply source to said amplifier;

wherein said first and second direct current cut-off devices as well as said first and second low-pass filters are composed of microstrip lines, and said parasitic signal suppression circuit suppressing a parasitic signal at the output of said EHF oscillator from being transmitted to said output of the EHF local oscillation device and simultaneously passing a desired main signal to said output of said EHF local oscillation device.

* * * * *

UNITED STATES PATENT AND TRADEMARK OFFICE
CERTIFICATE OF CORRECTION

PATENT NO. : 5,214,395
DATED : May 25, 1993
INVENTOR(S) : Ki-ho Yun

It is certified that error appears in the above-identified patent and that said Letters Patent is hereby corrected as shown below:

ON title page, Item [75] Inventor City should be changed from "Suwon" to --Kyunggi--.

Col. 1, line 24, "109" should be --$10^9$--.

Col. 3, line 5, "$V_d$" should be --$V_{ds}$--.

Col. 3, line 44, "20" should be --20,--.

Col. 3, line 57, "40" should be --40,--.

Signed and Sealed this

Third Day of May, 1994

Attest:

BRUCE LEHMAN

*Attesting Officer*     *Commissioner of Patents and Trademarks*